March 18, 1958 D. W. FOSS 2,827,612

TUNING MECHANISM FOR REFERENCE CAVITY RESONATORS

Filed Dec. 21, 1956 2 Sheets-Sheet 1

INVENTOR.
DAVID W. FOSS
BY Edgar O. Rost
ATTORNEY

March 18, 1958 D. W. FOSS 2,827,612

TUNING MECHANISM FOR REFERENCE CAVITY RESONATORS

Filed Dec. 21, 1956 2 Sheets-Sheet 2

INVENTOR.
DAVID W. FOSS
BY Edgar O. Rost
ATTORNEY

United States Patent Office 2,827,612

Patented Mar. 18, 1958

2,827,612

TUNING MECHANISM FOR REFERENCE CAVITY RESONATORS

David W. Foss, Beverly, Mass., assignor to Bomac Laboratories, Inc., Beverly, Mass., a corporation of Massachusetts Application December 21, 1956, Serial No. 629,946

4 Claims. (Cl. 333—83)

The present invention relates to temperature compensated reference cavity resonators of the type shown in U. S. Patent 2,752,576 having a tuning mechanism for precise selection of predetermined resonant frequencies and more particularly to an improved tuning mechanism for the selection of a greater number of resonant frequencies thereby enlarging the tuning range.

Devices of the type shown in the aforementioned patent have a range of preselected resonant frequencies which will remain accurate despite varied operating conditions including wide temperature variations, vibration, pressure and humidity. As shown in the aforementioned patent, however, the number of selectable frequencies is limited by the structure to a maximum of six settings since there is provision for only twelve frequency adjustment pins in the stationary member with each opposed pairs of said pins being set to the same dimensions. With this structure the tuning range is generally limited since the displacement of the tuning plunger within the resonant cavity by a distance required to give greater than a 10 megacycle change for each setting may be disadvantageous. Additional adjustment pins may be provided in the circular array if the stationary member diameter is enlarged. However, such a change would necessitate enlargement of all the mechanical components of the tuning structure which may not only increase expense of fabrication but also result in a cumbersome mechanism extending beyond the cavity resonator.

In applications where a wider overall frequency range is desired, it has been found that to enlarge the spacings between opposed pairs of pins as well as the length of the cam plate may produce a distinct wobble which can upset the critical dimensions. With the present invention, however, a two-fold increase in tuning range may be realized without in any way altering the overall tuning mechanism dimensions.

The primary object of the invention, therefore, is to provide an improved tuning mechanism for reference cavity resonators.

A further object is to provide an improved tuning mechanism for reference cavity resonators which permits a wider tuning range with assured critical accuracy and smoothness in operation.

To achieve the objects enumerated, my disclosure features a novel rotatable member which permits the positioning of another complete set of frequency adjustment pins within the stationary pin support member of the aforementioned patent. With this arrangement it is now possible to tune the cavity resonator over a much larger frequency band than heretofore possible.

Other objects, features and advantages will be evident after consideration of the following detailed specification together with the accompanying drawings, in which.

Figure 1:
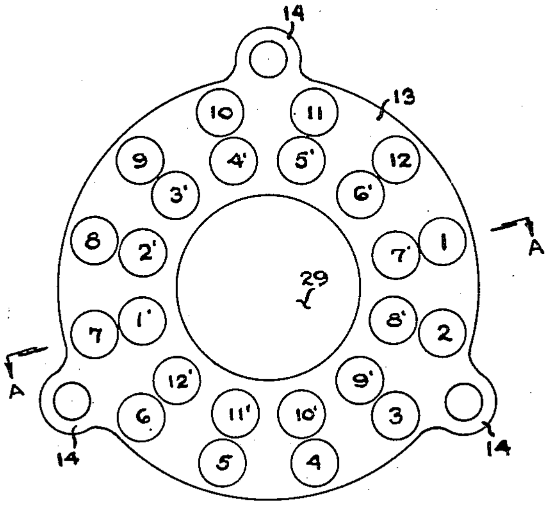
Fig. 1 is a plan view of the stationary pin support member of the illustrative embodiment.

Referring to the drawings, Fig. 1 shows the stationary pin support member 13 of the tuning mechanism having a plurality of bosses 14 for mounting in accordance with the teachings of the aforementioned Patent 2,752,576. A circular array of evenly spaced frequency adjustment pins 1—12 are positioned within member 13 near the edge thereof. Under the teachings of the prior art, diametrically opposed pairs of pins would be set to the same dimension below the bottom surface of member 13. Hence such a tuning structure would have pins 1 and 7 similarly positioned and this would result in six varied positions of the tuning plunger to give six resonant frequency settings.

In the practice of the present invention I provide a second array of frequency adjustment pins encompassing a complete circle within the first array of pins. To clearly distinguish the principle of operation of the improved tuning structure, this second array of pins has been indicated by numerals 1′ to 12′. With this embodiment, I now provide for equal settings of one pin in the outside and one in the inside array diametrically opposed to the first pin. Hence in Fig. 1 pins 1 and 1′ would be equally spaced from the under-surface of member 13 while pins 7 and 7′ would be similarly set to another dimension for a different resonant frequency. The positioning of the pins will be clearly understood by referring to Fig. 3 where a cross-sectional view through member 13 is shown.

Figure 2:
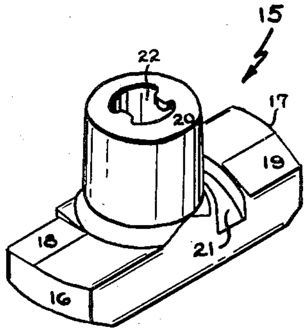
Fig. 2 is a perspective view of my improved rotatable member.
Figures 3, 4, 5:
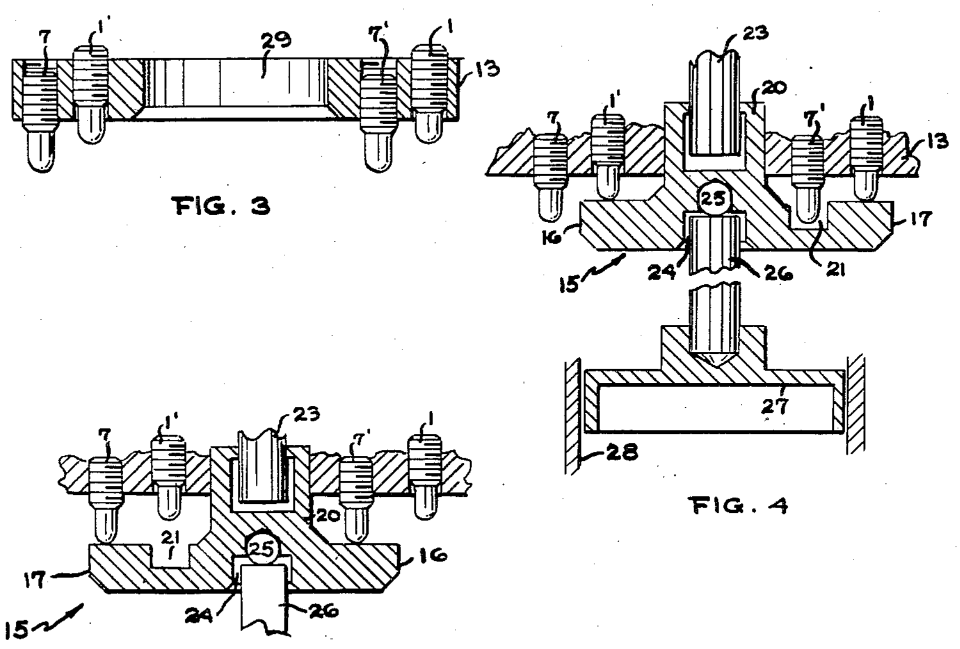
Fig. 3 is a detailed cross-sectional view taken along the line A—A in Fig. 1.
Fig. 4 is a cross-sectional view illustrating the cooperative relationship of the components of the improved tuning mechanism.
Fig. 5 is a cross-sectional view similar to Fig. 4 with the rotatable member rotated 180°.

The rotatable member which engages the tips of the aforementioned pins to thereby axially displace the tuning plunger is shown in Figs. 2 and 4 and is indicated generally as 15. This member comprises two wing portions 16 and 17 each provided with a slightly inclined ramp 18 and 19 and a central hub portion 20. Wing portion 17 is further provided with a circular groove or slot 21 dimensioned to provide clearance for the longer extending pins along the inner array. A reentrant bore 22 provided in hub portion 20 is utilized for engaging a shaft 23 of a suitable detent switch mechanism as shown in the aforementioned Patent 2,752,576. It may also be pointed out that member 15 wing portion 16 is shortened sufficiently to provide for clearance of the longer extending pins such as 7 when the member is rotated.

In the underside of member 15 a central bore 24 is provided to receive the ball pivot 25 coupling to a shaft 26 having a tuning plunger 27 disposed within the resonant cavity 28 of well-known construction. In the assembly of the components of the tuning mechanism, hub portion 20 of member 15 is positioned within a central passageway 29 in stationary pin support member 13.

Referring now to Fig. 5 the cooperative relationship of members 13 and 15 will be evident. Here the rotatable member 15 has been rotated 180° from the position shown in Fig. 4. It will be noted that now the tips of pins 7 and 7′ contact wing portions 17 and 16 respectively and the distance between the members has been increased with a corresponding increase in the depth of insertion of the tuning plunger 27 within the resonant cavity.

With prior art design it was only possible to set pins 1—6 at progressively varying distances since opposed pairs of pins were necessarily set to the same dimensions. Hence only six settings were possible with the rotatable member being rotated 150°. Now with the improvement of the present invention it is possible to set pins 7—12 to a still further progressively varying distance and the rotatable member may be rotated 330° which results in twelve frequency settings or a doubling of the usefulness of the overall tuned cavity resonator without any sacrifice in accuracy or environmental operating conditions.

Figure 6:
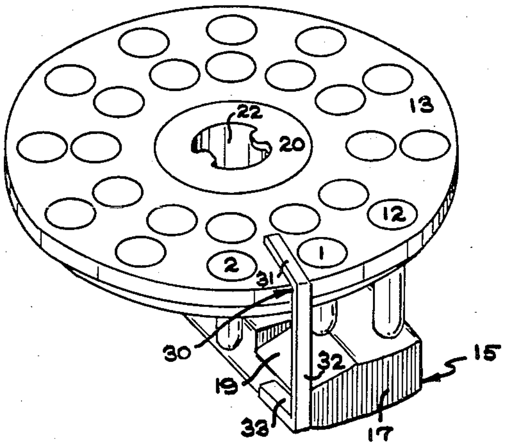
Fig. 6 is a perspective view illustrative of the structure for limiting movement of the rotatable member.

Fig. 6 illustrates the furthermost setting permissible and it may be noted that there is a sharp drop back to the shortest setting represented by pin 1. This sudden change in gradual movement of the components of the tuning mechanism may result in damage to the pin surfaces. It is, therefore, suggested that some means of engaging member 15 be provided between pins 12 and 1. Member 15 may be rotated initially clockwise to the point of engaging the stop and then counter-clockwise back to the starting position. In Fig. 6 I have shown such a stopping member 30 to engage the forward face of wing portion 17 just beyond the point of engaging pin 12. Member 30 comprises a horizontal section 31 secured to the upper portion of stationary member 13 with a downward extending portion 32 perpendicular thereto. Another horizontal section 33 is provided at the terminal end extending parallel to section 31. Portion 32 is dimensioned to engage wing portion 17 and must provide clearance when member 15 is rotated through the intermediate lower pin settings.

If desired an alternative stopping arrangement may be provided simply by eliminating frequency pin 12 and inserting a longer pin to engage member 15. With such a structure, however, only an eleven position tunable cavity resonator would be realized. It may also be possible to provide a stop mechanism within the detent switch mechanism which cooperates through shaft 23 with the rotating member 15.

What is claimed is:

1. Tuning apparatus to axially displace a tuning plunger within the resonant cavity of a reference cavity resonator to a plurality of predetermined settings to thereby tune said resonator to fixed resonant frequencies comprising a stationary member having a first set of axially adjustable pins disposed in circular array therein, a second set of similarly adjustable pins disposed within said first circular array, the tips of all said pins extending below the lower surface of said stationary member with each pin in said first circular array being set at a variable distance and a diametrically opposed pin in said second circular array being set to a similar distance, a rotatable member having a hub portion and two wing sections perpendicular thereto with one wing section having a length greater than the radius of said first circular array and the other wing section terminating intermediate the first and second circular array, said longer wing section having an annular groove disposed at an intermediate point between said hub portion and the end thereof, said annular groove being dimensioned to provide clearance for the longest extending pin in the second circular array during rotation of said rotatable member, said rotatable member cooperating with said stationary member to contact at least one pin in the first array of pins and one pin in the second array of pins simultaneously at all times.

2. Tuning apparatus to axially displace a tuning plunger within the resonant cavity of a reference cavity resonator to a plurality of predetermined settings to thereby tune said resonator to fixed resonant frequencies comprising a cylindrical stationary member having an outer circular array of adjustable pins disposed therein near the edge thereof, an inner circular array of similarly adjustable pins disposed within said outer circular array, the tips of all said pins extending below the lower surface of said stationary member with each pin in said outer array being set at a variable distance and a diametrically opposed pin in said inner array being set to a similar distance, a rotatable member having a central hub portion and two wing sections perpendicular thereto with one wing section having a length greater than the radius of said outer pin circle and the other wing section being shortened spfficiently to lie within said outer pin circle, said longer wing section having an annular groove disposed at an intermediate point between said hub portion and the end thereof, said annular groove being dimensioned to provide clearance for the longest extending pin in the inner array during rotation of said rotatable member, said rotatable member cooperating with said stationary member to contact at least one pin in the outer array simultaneously with one pin in the inner array at all times.

3. Tuning apparatus according to claim 2 wherein each pin in the entire outer circular array protrudes progressively further from the lower surface of said stationary member.

4. Tuning apparatus according to claim 2 wherein means are secured to said stationary member to prevent further clockwise rotation of said rotatable member beyond the longest pin setting in the outer circular array.

References Cited in the file of this patent

UNITED STATES PATENTS 2,752,576 Hilliard ---------------- June 26, 1956